(12) United States Patent
Ma et al.

(10) Patent No.: US 12,027,722 B2
(45) Date of Patent: Jul. 2, 2024

(54) HOUSING, BATTERY, AND ELECTRONIC APPARATUS

(71) Applicant: NINGDE AMPEREX TECHNOLOGY LIMITED, Ningde (CN)

(72) Inventors: Wu Ma, Ningde (CN); Peipei Guo, Ningde (CN); Liqing Lin, Ningde (CN); Guowen Zhang, Ningde (CN)

(73) Assignee: NINGDE AMPEREX TECHNOLOGY LIMITED, Ningde (CN)

( * ) Notice: Subject to any disclaimer, the term of this patent is extended or adjusted under 35 U.S.C. 154(b) by 524 days.

(21) Appl. No.: 17/281,436

(22) PCT Filed: Sep. 16, 2020

(86) PCT No.: PCT/CN2020/115670
§ 371 (c)(1),
(2) Date: Mar. 30, 2021

(87) PCT Pub. No.: WO2021/068721
PCT Pub. Date: Apr. 15, 2021

(65) Prior Publication Data
US 2021/0391626 A1    Dec. 16, 2021

(30) Foreign Application Priority Data

Oct. 10, 2019    (CN) .......................... 201921689971.6

(51) Int. Cl.
*H01M 50/342* (2021.01)
*H01M 50/102* (2021.01)
(Continued)

(52) U.S. Cl.
CPC ..... *H01M 50/3425* (2021.01); *H01M 50/102* (2021.01); *H01M 50/1245* (2021.01); *H05K 5/0086* (2013.01)

(58) Field of Classification Search
CPC ........... H01M 50/3425; H01M 50/102; H01M 50/1245; H05K 5/0086
See application file for complete search history.

(56) References Cited

U.S. PATENT DOCUMENTS

| | | | |
|---|---|---|---|
| 6,964,690 B2 * | 11/2005 | Goda .................... | H01M 50/119 429/56 |
| 8,354,181 B2 | 1/2013 | Suzuki et al. | |
| 2012/0219834 A1 * | 8/2012 | Park .................. | H01M 50/3425 429/89 |

FOREIGN PATENT DOCUMENTS

| | | |
|---|---|---|
| CN | 1591929 A | 3/2005 |
| CN | 101911337 A | 12/2010 |

(Continued)

OTHER PUBLICATIONS

International Search Report dated Dec. 2, 2020, issued in counterpart application No. PCT/CN2020/115670 (4 pages).

(Continued)

*Primary Examiner* — Mukundbhai G Patel
(74) *Attorney, Agent, or Firm* — WHDA, LLP (57) ABSTRACT

A housing is disclosed, including an accommodating cavity, where a surface of the housing is provided with a groove, a thickness of an area provided with the groove in the housing is less than a thickness of an area provided with no groove in the housing, the housing further includes a protective layer, and the protective layer is disposed on the surface of the housing and covers an opening end of the groove. The groove helps discharge a pressure from the housing, and the protective layer can prevent the housing from being accidentally broken. This application further provides a battery (Continued)

to which the housing is applied, and an electronic apparatus to which the battery is applied.

12 Claims, 15 Drawing Sheets

(51) Int. Cl.
　　　*H01M 50/124*　　(2021.01)
　　　*H05K 5/00*　　　(2006.01)

(56) References Cited

FOREIGN PATENT DOCUMENTS

| | | |
|---|---|---|
| CN | 210668431 U | 6/2020 |
| JP | 2003-346762 A | 12/2003 |
| JP | 2005-142115 A | 6/2005 |
| JP | 2011-060600 A | 3/2011 |

OTHER PUBLICATIONS

Written Opinion dated Dec. 2, 2020, issued in counterpart application No. PCT/CN2020/115670 (5 pages).

\* cited by examiner

HOUSING, BATTERY, AND ELECTRONIC APPARATUS

CROSS-REFERENCE TO RELATED APPLICATION

This application is the national phase entry of International Application No. PCT/CN2020/115670, filed on Sep. 16, 2020, which claims priority to and benefits of Chinese Patent Application Serial No. 201921689971.6, filed with the China National Intellectual Property Administration on Oct. 10, 2019, the entire content of which is incorporated herein by reference.

TECHNICAL FIELD

This application relates to the battery field, and in particular, to a housing, a battery to which the housing is applied, and an electronic apparatus to which the battery is applied.

BACKGROUND

Batteries are ideal energy sources for portable electronic devices because of the high operating voltage, high energy density, low self-discharge, and long life. A battery being overcharged, over-discharged, or short-circuited may cause an excessively large operating current in the battery and is prone to gas generation resulting from an excessively high battery temperature, thereby leading to an excessively high pressure inside the battery. When the pressure inside the battery exceeds a bearing capability of a package housing of the battery, the battery may explode to cause safety problems.

SUMMARY

In view of the foregoing problem, it is necessary to provide a battery housing capable of improving safety.

It is also necessary to provide a battery to which the housing is applied, and an electronic apparatus to which the battery is applied.

A housing is disclosed, including an accommodating cavity, where a surface of the housing is provided with a groove, a thickness of an area provided with the groove in the housing is less than a thickness of an area provided with no groove in the housing, the housing further includes a protective layer, and the protective layer is disposed on the surface of the housing and covers an opening end of the groove.

Further, the housing includes an inner surface facing towards the accommodating cavity and an outer surface facing away from the accommodating cavity, and the groove is provided in the outer surface of the housing and/or the inner surface of the housing.

Further, the housing includes a first housing and a second housing, the first housing is provided with an accommodating groove, and the second housing is fitted to the first housing to encapsulate the accommodating groove and form the accommodating cavity.

Further, the first housing includes a bottom plate and a side wall, the side wall encloses the bottom plate to form the accommodating groove, and the groove is provided in a surface of at least one of the bottom plate and the side wall.

Further, there are a plurality of grooves that are spaced apart on the surface of the housing.

Further, a thickness of the protective layer is greater than 0.01 millimeters.

Further, the groove is a V-groove, a rectangular groove, or an arc groove.

Further, a deepest position of the groove is in a dotted or linear form.

A battery is disclosed, including a battery core, where the battery further includes the housing described above, and the battery core is accommodated in the accommodating cavity.

An electronic apparatus is disclosed, and the electronic apparatus includes the battery described above.

The housing in this application is provided with the groove on the surface of the housing, and when an internal pressure of the accommodating cavity is excessively large, the housing can rapidly break to discharge the pressure from the groove, thereby avoiding explosion of the housing. The protective layer is disposed at the opening end of the groove, so as to prevent an element located in the accommodating cavity from accidentally colliding with or abutting against the groove to cause the housing to break at the groove, or prevent the housing from being accidentally broken at the groove due to external force applied to the housing.

REFERENCE NUMERALS OF MAIN COMPONENTS

| | |
|---|---|
| Housing | 100 |
| Accommodating cavity | 101 |
| Groove | 106 |
| Protective layer | 30 |
| Inner surface | 102 |
| Outer surface | 103 |
| First housing | 11 |
| Second housing | 13 |
| Accommodating groove | 110 |
| Bottom plate | 111 |
| Side wall | 113 |
| Battery | 200 |
| Battery core | 40 |
| Core body | 41 |
| Pole | 43 |
| Electronic apparatus | 300 |

This application will be further described with reference to the accompanying drawings in the following specific embodiments.

DETAILED DESCRIPTION

The following clearly describes the technical solutions in the embodiments of this application with reference to the accompanying drawings in the embodiments of this application. Apparently, the described embodiments are only some rather than all of the embodiments of this application. All other embodiments obtained by a person of ordinary skill in the art based on the embodiments of this application without creative efforts shall fall within the protection scope of this application.

Unless otherwise defined, all technical and scientific terms used herein shall have the same meanings as commonly understood by those skilled in the art to which this application belongs. The terms used in the specification of this application are merely intended to describe specific embodiments, but not intended to constitute any limitation on this application.

Some embodiments of this application are described in detail below with reference to the accompanying drawings. In absence of conflicts, the following embodiments and features in the embodiments may be combined.

Referring to FIG. 1 to FIG. 13, a housing 100 includes an accommodating cavity 101, and a surface of the housing 100 is provided with a groove 106, where a thickness $H_1$ of an area provided with the groove 106 in the housing 100 is less than a thickness $H_2$ of an area provided with no groove 106 in the housing 100. The housing 100 further includes a protective layer 30, and the protective layer 30 is disposed on the surface of the housing 100 and covers an opening end of the groove 106. When an internal pressure of the accommodating cavity 101 is excessively large, the housing 100 can rapidly break to discharge the pressure from the groove 106 to push open the protective layer 30, thereby avoiding explosion of the housing 100. In normal cases, the protective layer 30 is disposed at the opening end of the groove 106, so as to prevent an element located in the accommodating cavity 101 from accidentally colliding with or abutting against the groove 106 to cause the housing 100 to break at the groove 106, or prevent the housing 100 from being accidentally broken at the groove 106 due to external force applied to the housing 100.

Figure 2:
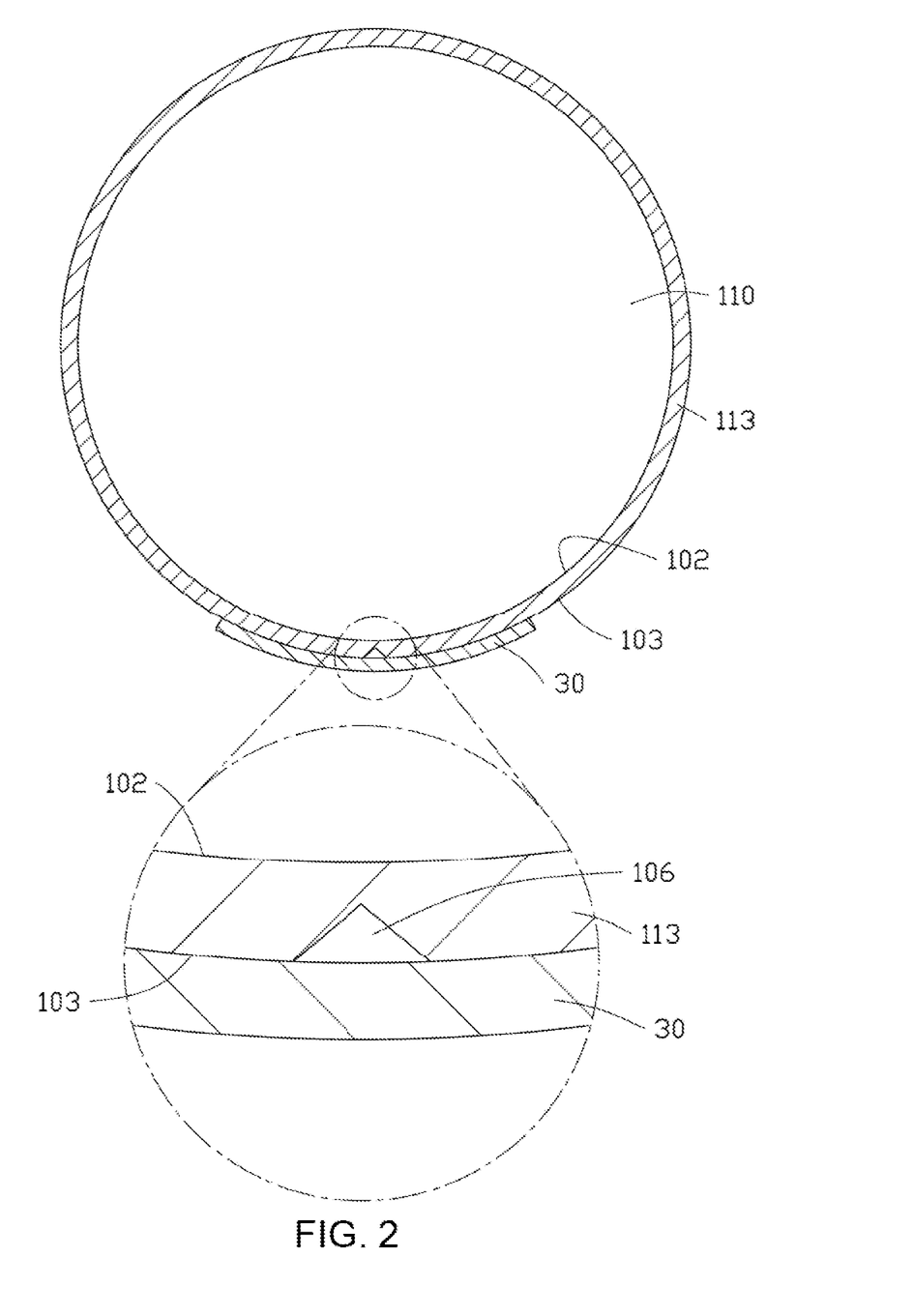
FIG. 2 is a schematic cross-sectional diagram of the housing shown in FIG. 1 in a II-II direction.
Figure 3:
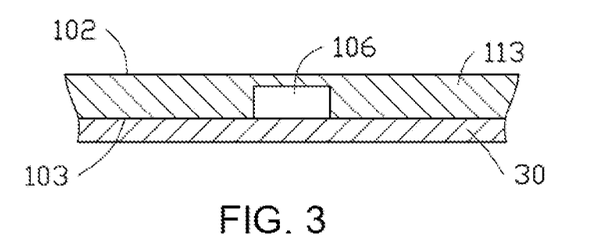
FIG. 3 is a schematic partial cross-sectional view of a housing according to an embodiment of this application.
Figure 4:
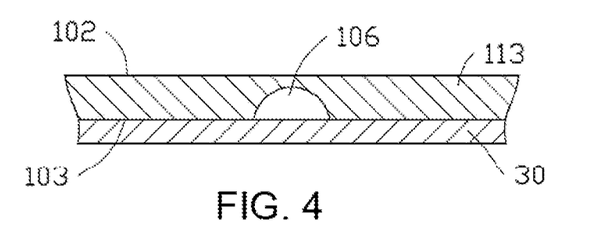
FIG. 4 is a schematic partial cross-sectional view of a housing according to another embodiment of this application.

In this embodiment, referring to FIG. 2, FIG. 3, and FIG. 4, the groove 106 may be, but is not limited to, a V-shaped groove, a rectangular groove, or an arc groove.

Optionally, a deepest position of the groove 106 is in a dotted or linear form. When the internal pressure of the housing 100 is excessively large, the deepest position of the groove 106 in the dotted or linear form helps concentrate stress at the deepest position of the groove 106, so that the housing 100 breaks at the groove 106. In addition, the deepest position of the groove 106 in the dotted or linear form allows the housing 100 to break in a small range at the groove 106, avoiding debris generated during breakage.

In this embodiment, the groove 106 may be formed in a machining or laser cutting manner.

Figure 5:
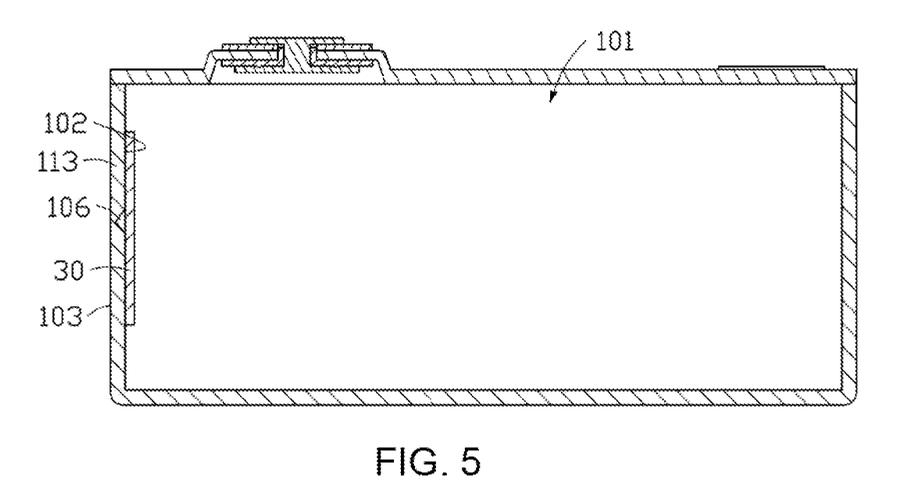
FIG. 5 is a schematic partial cross-sectional view of a housing according to still another embodiment of this application.

As shown in FIG. 5, the housing 100 further includes an inner surface 102 facing towards the accommodating cavity 101 and an outer surface 103 facing away from the accommodating cavity 101. In some embodiments, referring to FIG. 1, the groove 106 is provided in the outer surface 103 of the housing 100. In other embodiments, referring to FIG. 5, the groove 106 may alternatively be provided in the inner surface 102 of the housing 100.

Figure 1:
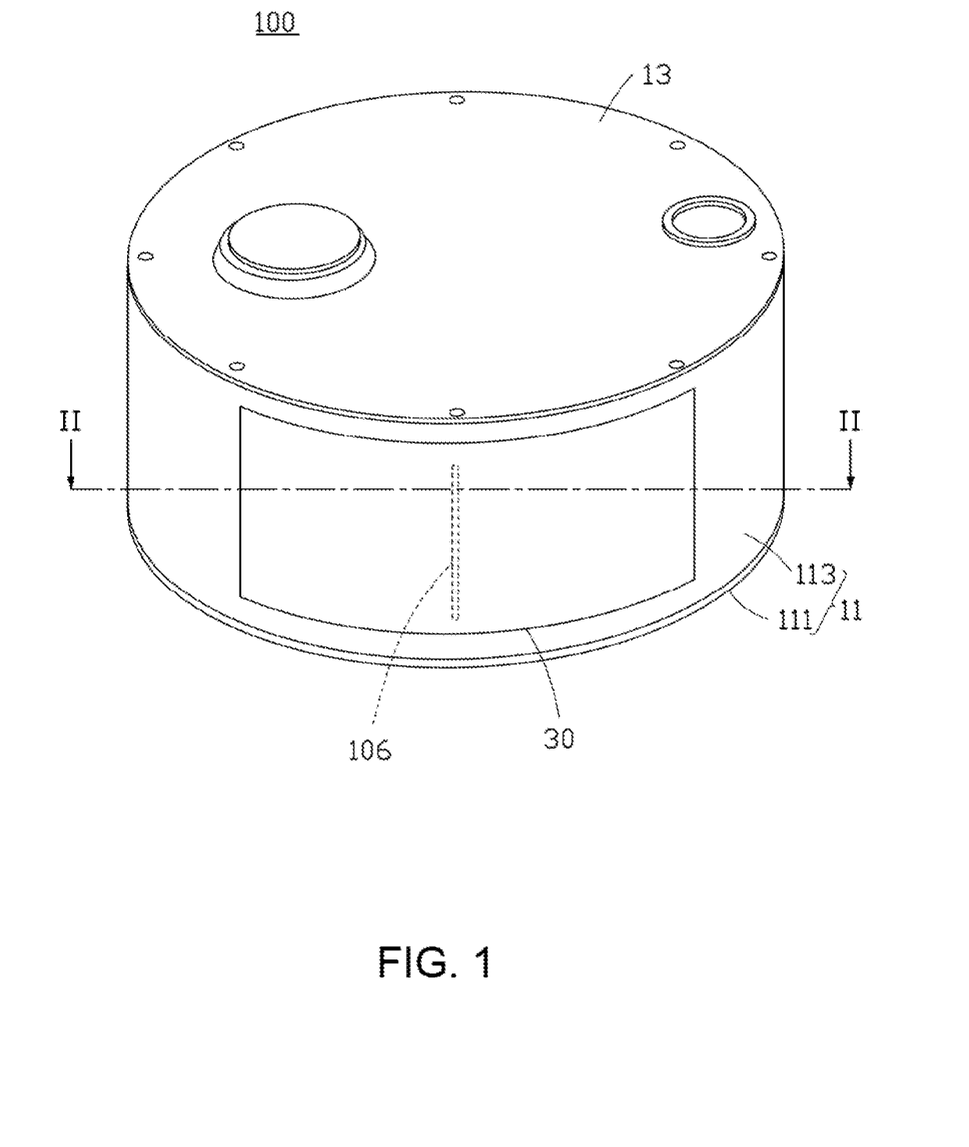
FIG. 1 is a schematic diagram of a three-dimensional structure of a housing according to an embodiment of this application.
Figure 6:
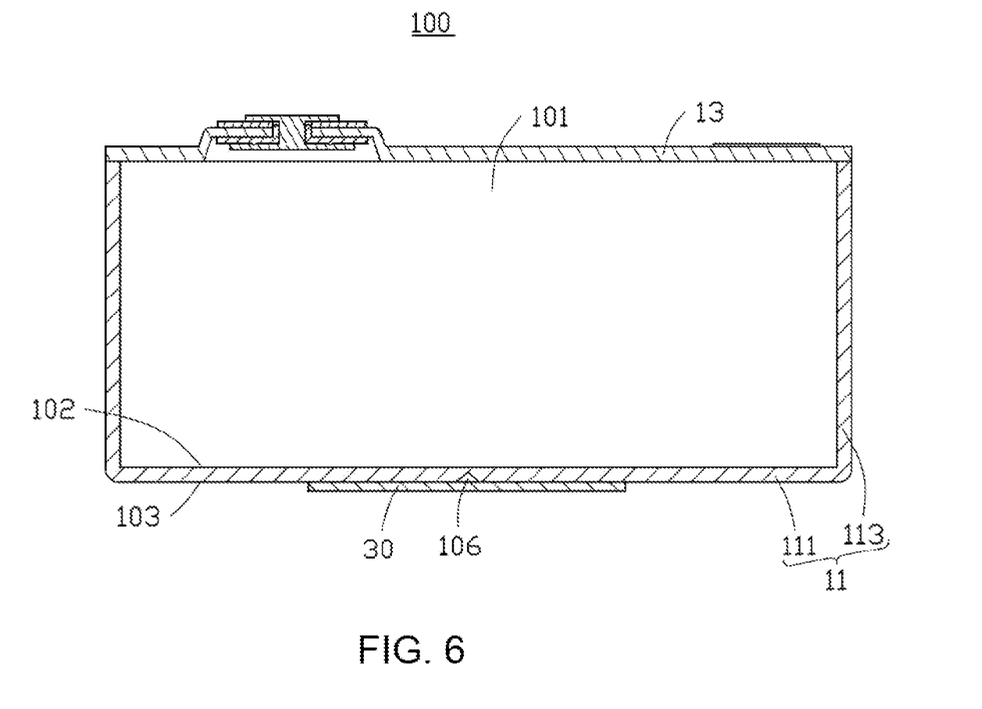
FIG. 6 is a schematic cross-sectional diagram of a housing according to an embodiment of this application.
Figure 7:
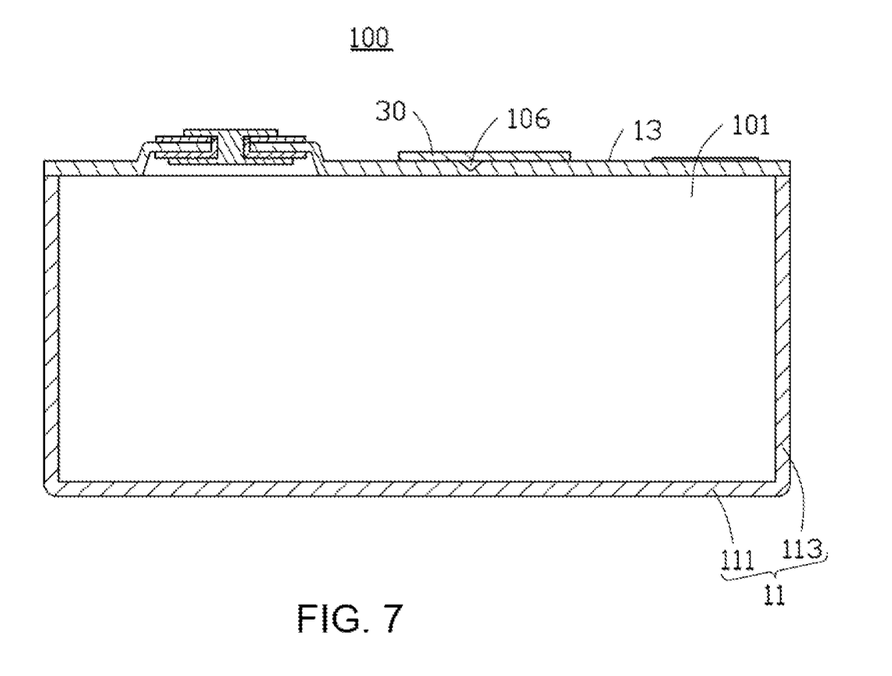
FIG. 7 is a schematic cross-sectional diagram of a housing according to another embodiment of this application.
Figure 8:
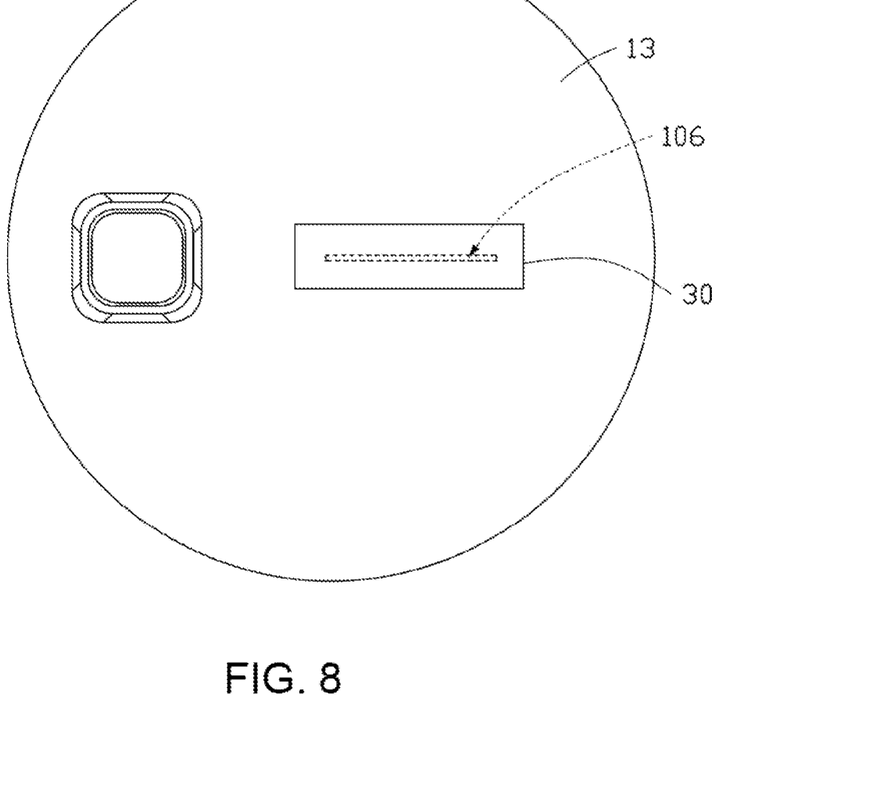
FIG. 8 is a schematic top view of a housing according to an embodiment of this application.
Figure 9:
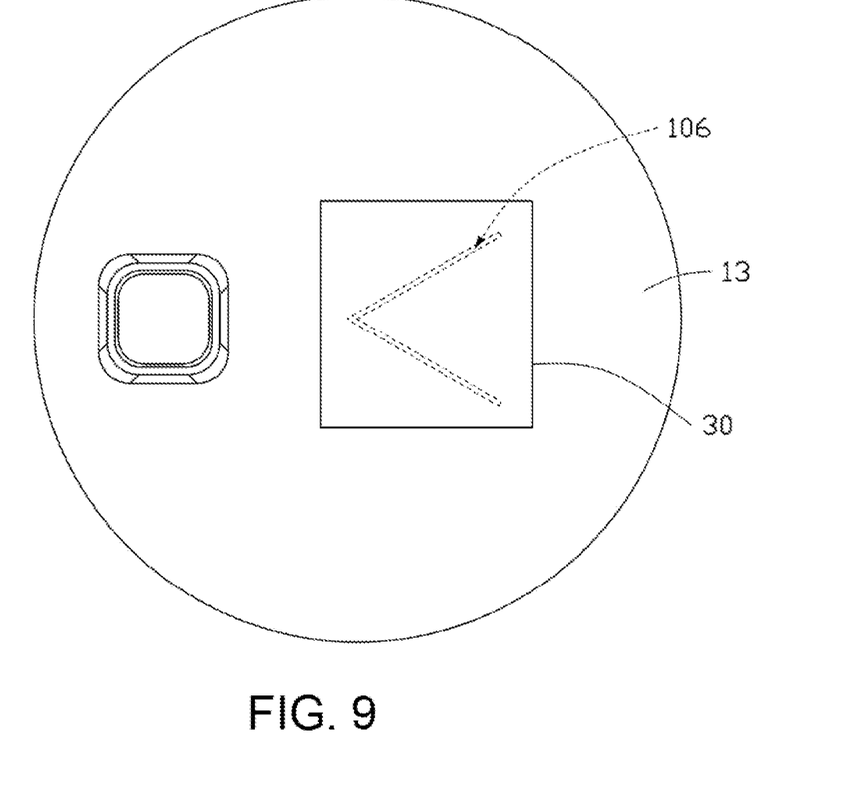
FIG. 9 is a schematic top view of a housing according to another embodiment of this application.
Figure 10:
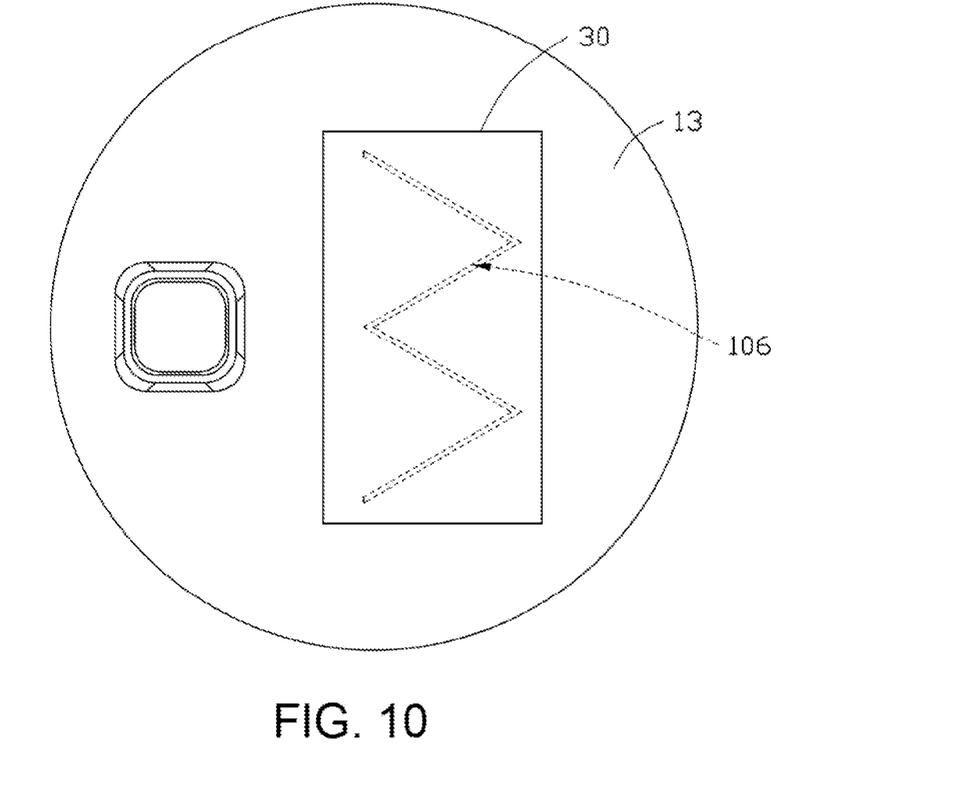
FIG. 10 is a schematic top view of a housing according to still another embodiment of this application.
Figure 11:
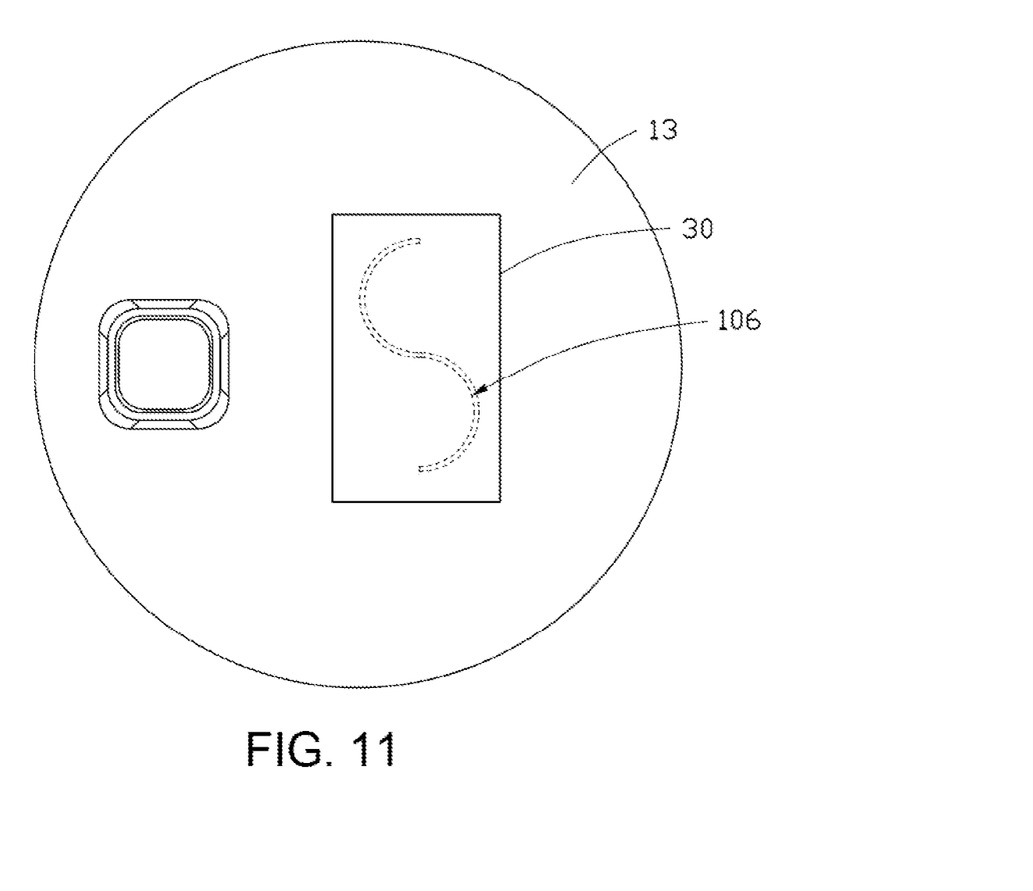
FIG. 11 is a schematic top view of a housing according to yet another embodiment of this application.
Figure 12:
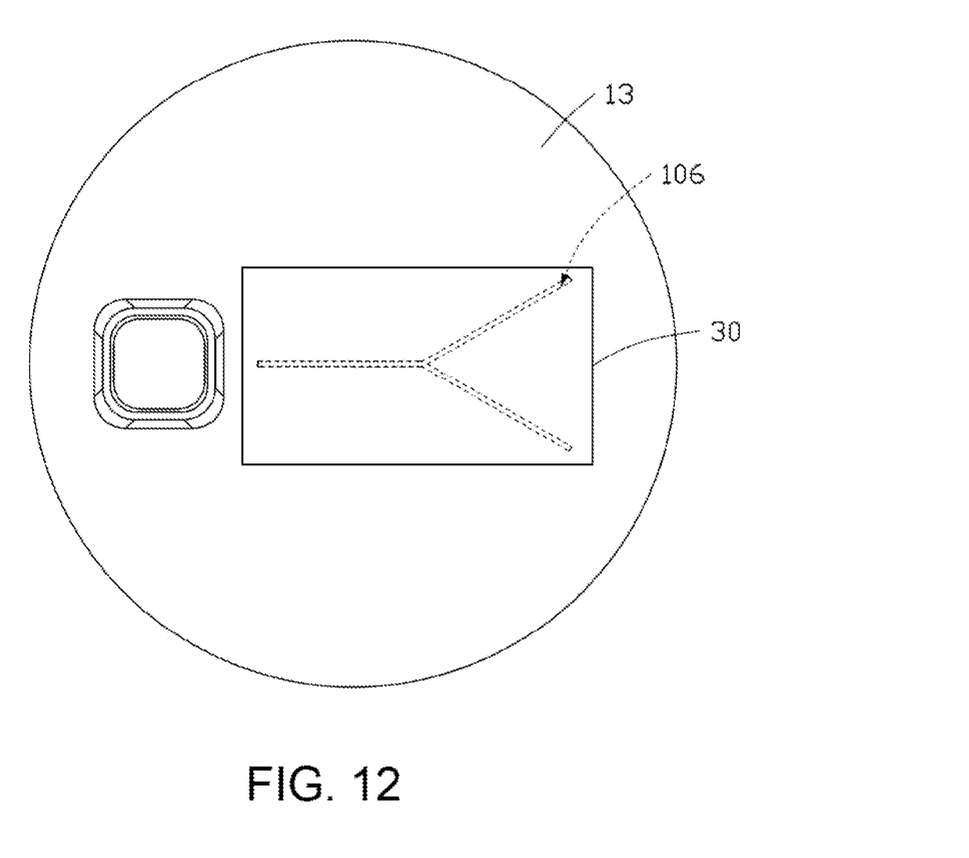
FIG. 12 is a schematic top view of a housing according to another embodiment of this application.
Figure 13:
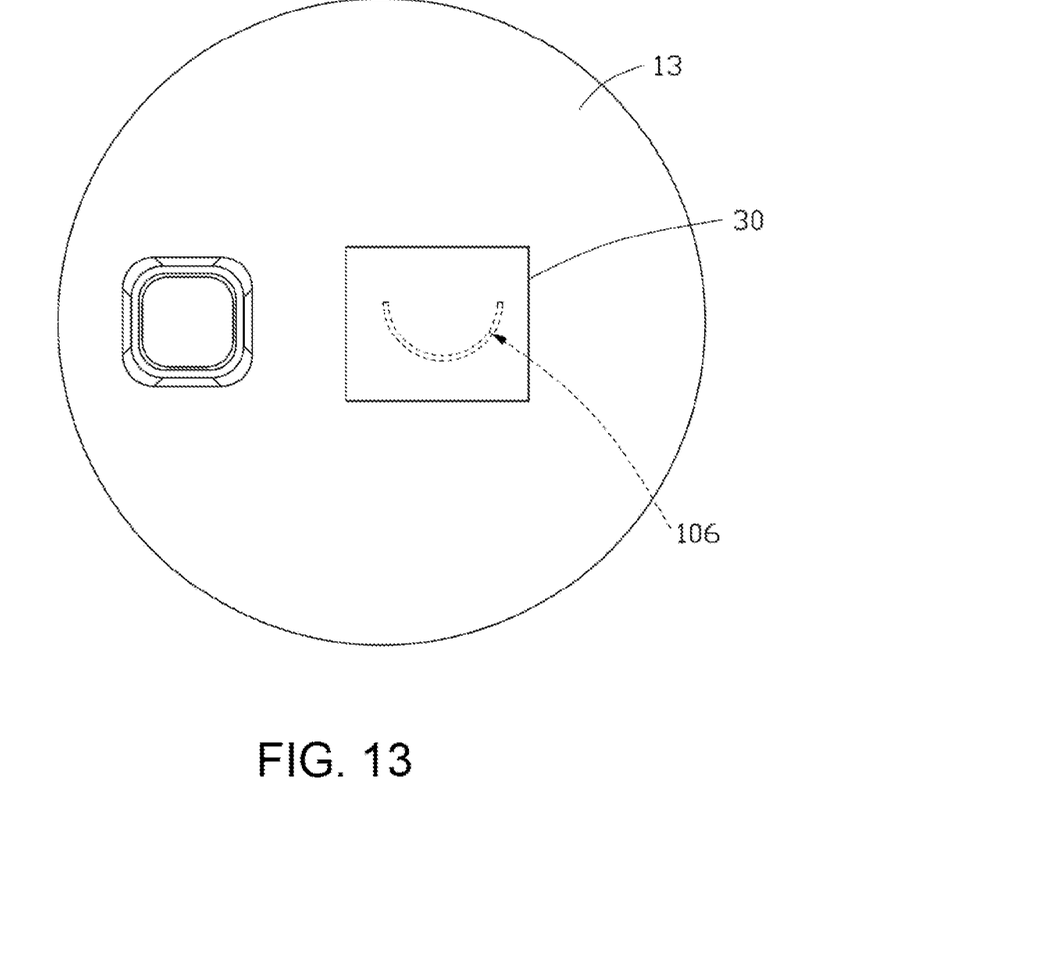
FIG. 13 is a schematic top view of a housing according to still another embodiment of this application.

The housing 100 includes a first housing 11 and a second housing 13, and the first housing is provided with an accommodating groove 110. The second housing 13 is fitted to the first housing 11 to encapsulate the accommodating groove 110 and form the accommodating cavity 101. The first housing 11 includes a bottom plate 111 and a side wall 113. The side wall 113 encloses the bottom plate 111 to form the accommodating groove 110. Referring to FIG. 1, FIG. 6, and FIG. 7, the groove 106 may be provided in a surface of the bottom plate 111, the side wall 113, and/or the second housing 13.

In this embodiment, a thickness of the protective layer 30 is greater than 0.01 millimeters. Optionally, the thickness of the protective layer is greater than 0.5 millimeters.

In some embodiments, the protective layer 30 may be, but is not limited to, a plastic film or a tape. The protective layer 30 may be disposed on the surface of the housing 100 in a bonding manner. In other embodiments, the protective layer 30 may alternatively be secured to the surface of the housing 100 in another manner such as being engaged.

In some embodiments, referring to FIG. 8, FIG. 9, FIG. 10, FIG. 11, FIG. 12, and FIG. 13, there is one groove 106, and the opening end of the groove 106 may be in any shape, such as linear, V-shaped, W-shaped, S-shaped, Y-shaped, or arc shape, etc. In other embodiments, there may be a plurality of grooves 106 that are spaced apart, and the plurality of grooves 106 are arranged on the surface of the housing 100 to form a pattern of any shape such as a linear shape, a V-shape, a W-shape, an S-shape, a Y-shape, or an arc shape.

Figure 14:
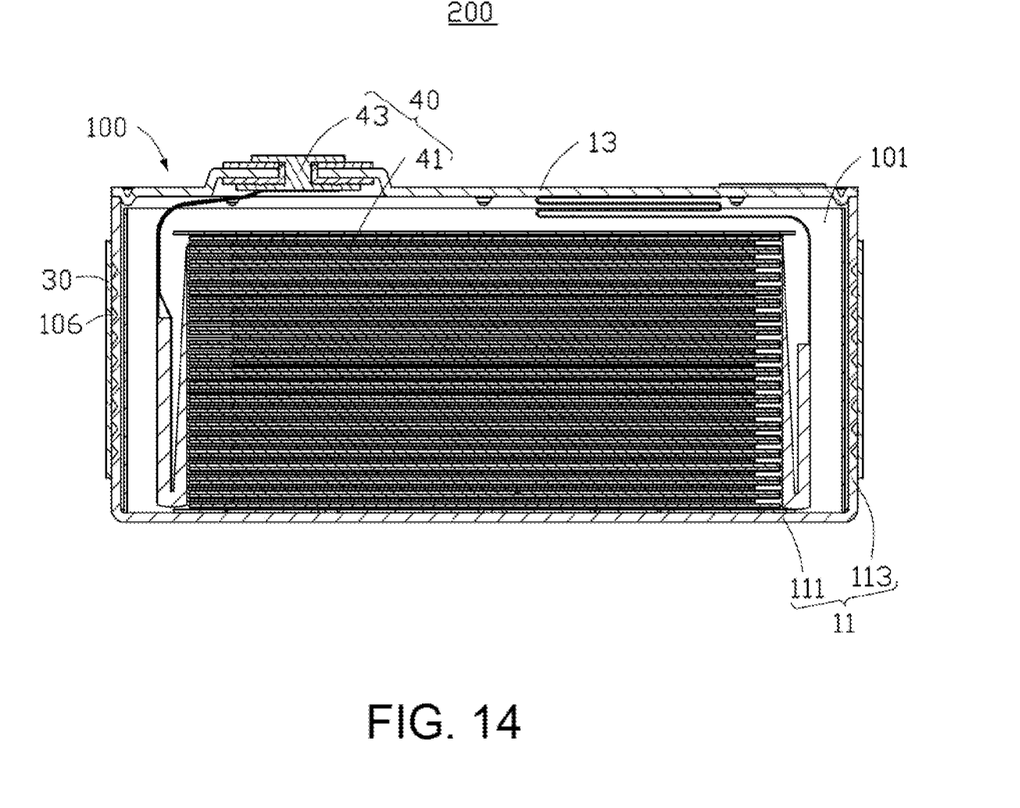
FIG. 14 is a schematic cross-sectional diagram of a battery according to an embodiment of this application.

Referring to FIG. 14, the housing 100 is applied to a battery 200. The battery 200 further includes a battery core 40 and a pole 43. The battery core 40 is accommodated in the accommodating cavity 101.

The battery core 40 may be a laminated core or a wound core.

In this embodiment, the battery core 40 further includes a core body 41. The core body 41 is accommodated in the accommodating cavity 101. The pole 43 is disposed on the housing 100 and is electrically connected to the core body 41. Specifically, in this embodiment, the pole 43 is disposed on the second housing 13.

Figure 15:
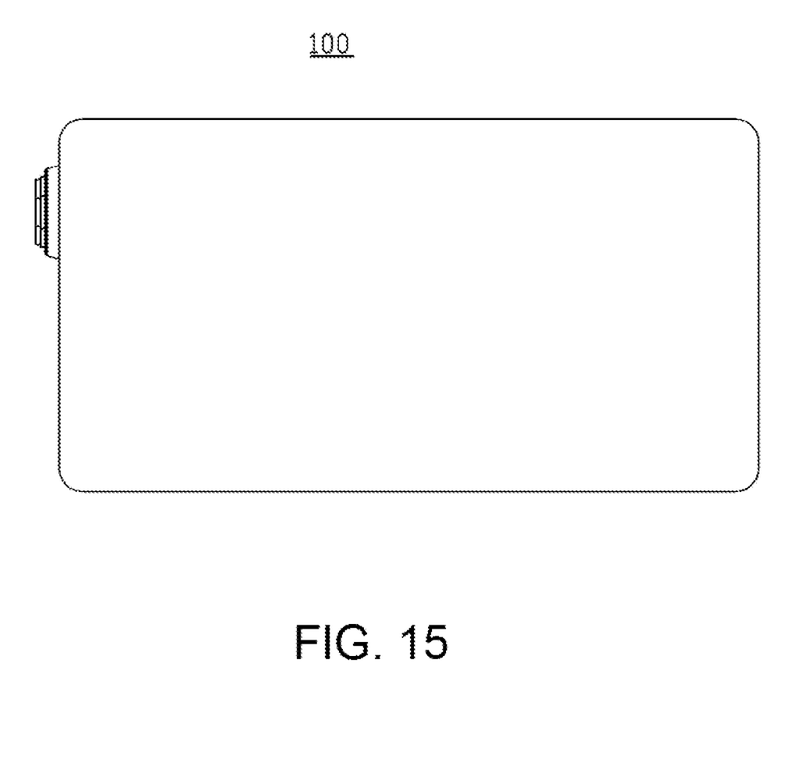
FIG. 15 is a schematic structural diagram of a housing according to an embodiment of this application.
Figure 16:
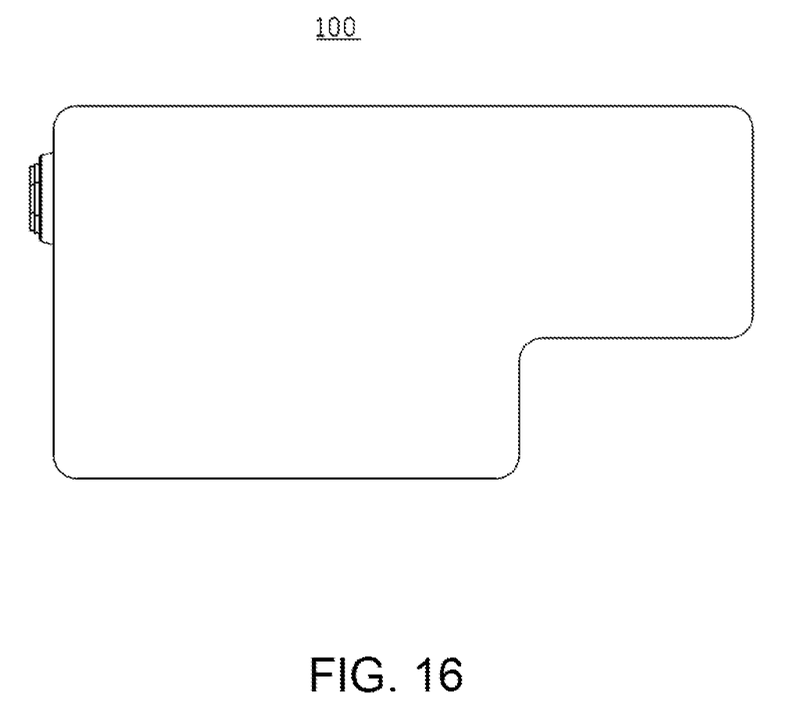
FIG. 16 is a schematic structural diagram of a housing according to another embodiment of this application.

The battery core 40 may be cylindrical, square, or in any other shape. Referring to FIG. 15 and FIG. 16, a shape of the housing 100 may alternatively be adapted to a shape of the battery core 40.

Figure 17:
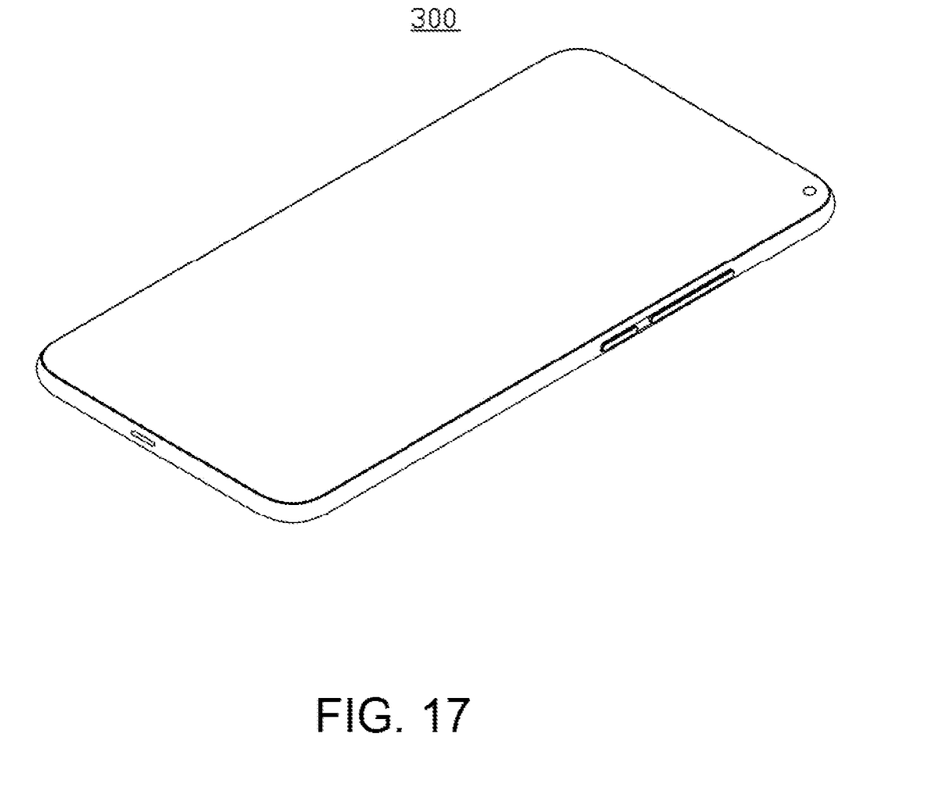
FIG. 17 is a schematic structural diagram of an electronic apparatus according to an embodiment of this application.

Referring to FIG. 17, the foregoing battery 200 is applied to an electronic apparatus 300. The electronic apparatus 300 may be a mobile phone, a tablet computer, an e-reader, a notebook computer, an in-vehicle device, a wearable device, or the like.

The housing 100 in this application is provided with the groove 106 on the surface of the housing 100. When the internal pressure of the accommodating cavity 101 is excessively large, the housing 100 can rapidly break to discharge the pressure from the groove 106 to push open the protective layer 30, thereby avoiding explosion of the housing 100. The protective layer 30 is disposed at the opening end of the groove 106, so as to prevent an element located in the accommodating cavity 101 from accidentally colliding with or abutting against the groove 106 to cause the housing 100 to break at the groove 106, or prevent the housing 100 from being accidentally broken at the groove 106 due to external force applied to the housing 100.

In addition, a person of ordinary skill in the art can make various other corresponding changes and modifications according to the technical concept of this application, and all such changes and modifications should fall within the protection scope of this application.

What is claimed is:

1. A housing, comprising an accommodating cavity, wherein a surface of the housing is provided with a groove having an opening end in the surface of the housing, a thickness of an area provided with the groove in the housing is less than a thickness of an area provided with no groove in the housing, the housing further comprises a protective layer having a thickness greater than 0.01 millimeters, the protective layer disposed on the surface of the housing in a bonding manner, wherein the protective layer extends over the opening end of the groove and covers the opening end of the groove; the protective layer is a tape;
   the housing comprises a first housing and a second housing, the first housing is provided with an accommodating groove, and the second housing is fitted to the first housing to encapsulate the accommodating groove and form the accommodating cavity; the first housing comprises a bottom plate and a side wall, the side wall encloses the bottom plate to form the accommodating groove, and the groove is provided in the bottom plate;
   the housing is cylindrical.

2. The housing according to claim 1, wherein the housing comprises an inner surface facing towards the accommodating cavity and an outer surface facing away from the accommodating cavity, and the groove is provided in the outer surface of the housing and/or the inner surface of the housing.

3. The housing according to claim 1, wherein there are a plurality of grooves that are spaced apart on the surface of the housing.

4. The housing according to claim 1, wherein the groove is a V-shaped groove, a rectangular groove, or an arc groove.

5. The housing according to claim 1, wherein a deepest position of the groove is in a dotted or linear form.

6. A battery, comprising a battery core, wherein the battery further comprises a housing accommodating the battery core, wherein the housing comprises an accommodating cavity, the battery core is accommodated in the accommodating cavity;
   wherein a surface of the housing is provided with a groove having an opening end in the surface of the housing, a thickness of an area provided with the groove in the housing is less than a thickness of an area provided with no groove in the housing, the housing further comprises a protective layer having a thickness greater than 0.01 millimeters, the protective layer disposed on the surface of the housing in a bonding manner, wherein the protective layer extends over the opening end of the groove and covers the opening end of the groove;
   the protective layer is a tape;
   the housing comprises a first housing and a second housing, the first housing is provided with an accommodating groove, and the second housing is fitted to the first housing to encapsulate the accommodating groove and form the accommodating cavity; the first housing comprises a bottom plate and a side wall, the side wall encloses the bottom plate to form the accommodating groove, and the groove is provided in the bottom plate;
   the housing is cylindrical.

7. The battery of claim 6, wherein the housing comprises an inner surface facing towards the accommodating cavity and an outer surface facing away from the accommodating cavity, and the groove is provided in the outer surface of the housing and/or the inner surface of the housing.

8. The battery of claim 6, wherein there are a plurality of grooves that are spaced apart on the surface of the housing.

9. The battery of claim 6, wherein the groove is a V-shaped groove, a rectangular groove, or an arc groove.

10. The battery of claim 6, wherein a deepest position of the groove is in a dotted or linear form.

11. An electronic apparatus, wherein the electronic apparatus comprises a load and a battery, wherein the battery is configured to transfer power to the load, the battery comprising a battery core and a housing accommodating the battery core wherein the housing comprises an accommodating cavity, and the battery core is accommodated in the accommodating cavity;
    wherein a surface of the housing is provided with a groove having an opening end in the surface of the housing, a thickness of an area provided with the groove in the housing is less than a thickness of an area provided with no groove in the housing, the housing further comprises a protective layer having a thickness greater than 0.01 millimeters, the protective layer disposed on the surface of the housing in a bonding manner, wherein the protective layer extends over the opening end of the groove and covers the opening end of the groove;
    the protective layer is a tape;
    the housing comprises a first housing and a second housing, the first housing is provided with an accommodating groove, and the second housing is fitted to the first housing to encapsulate the accommodating groove and form the accommodating cavity; the first housing comprises a bottom plate and a side wall, the side wall encloses the bottom plate to form the accommodating groove, and the groove is provided in the bottom plate;
    the housing is cylindrical.

12. The electronic apparatus of claim 11, wherein the housing comprises an inner surface facing towards the accommodating cavity and an outer surface facing away from the accommodating cavity, and the groove is provided in the outer surface of the housing and/or the inner surface of the housing.

* * * * *